United States Patent
Lin et al.

(10) Patent No.: US 12,216,176 B2
(45) Date of Patent: Feb. 4, 2025

(54) DISTRIBUTED BATTERY PROPERTY MEASUREMENT SYSTEM

(71) Applicant: Analog Devices International Unlimited Company, Limerick (IE)

(72) Inventors: Yijing Lin, Beijing (CN); Yiwei Bai, Shanghai (CN)

(73) Assignee: Analog Devices International Unlimited Company, Limerick (IE)

( * ) Notice: Subject to any disclaimer, the term of this patent is extended or adjusted under 35 U.S.C. 154(b) by 135 days.

(21) Appl. No.: 18/064,051

(22) Filed: Dec. 9, 2022

(65) Prior Publication Data

US 2023/0184847 A1 Jun. 15, 2023

(30) Foreign Application Priority Data

Dec. 10, 2021 (WO) ................ PCT/CN2021/137081

(51) Int. Cl.
*G01R 31/396* (2019.01)
*G01R 31/3842* (2019.01)
*G01R 31/389* (2019.01)
*G01R 31/392* (2019.01)
*H02J 7/00* (2006.01)

(52) U.S. Cl.
CPC ....... *G01R 31/396* (2019.01); *G01R 31/3842* (2019.01); *G01R 31/389* (2019.01); *G01R 31/392* (2019.01); *H02J 7/0047* (2013.01)

(58) Field of Classification Search
CPC .......................... G01R 31/396; G01R 31/389; G01R 31/3842; G01R 31/392; H02J 7/0047
See application file for complete search history.

(56) References Cited

U.S. PATENT DOCUMENTS

| | | | |
|---|---|---|---|
| 10,879,707 B2* | 12/2020 | Taylor, Jr. ........... | H02J 7/00306 |
| 2016/0226107 A1* | 8/2016 | Worry ................. | H01M 10/482 |
| 2019/0221893 A1* | 7/2019 | Marsili ............... | H01M 10/482 |
| 2020/0343755 A1* | 10/2020 | Jang ..................... | G01R 31/382 |
| 2023/0184842 A1* | 6/2023 | Lin ....................... | H01M 10/00 702/63 |
| 2024/0027533 A1* | 1/2024 | Loopik ................ | G01R 31/389 |

* cited by examiner

*Primary Examiner* — Christopher E Mahoney
(74) *Attorney, Agent, or Firm* — Schwegman Lundberg & Woessner, P.A.

(57) ABSTRACT

A battery management system may include a host microcontroller, operated in accordance with a first clock signal. The battery management system may also include a first sensor, which may be configured to measure a first value of a first group of one or more cells in a battery system. A first AFE circuit may include a first pulse-width modulation (PWM) controller, which may be configured to at least one of enable or power on the first sensor while a first PWM signal from the first PWM controller is in a first state, and may be configured to at least one of disable or power off the first sensor while the first PWM signal is in a second state. The first AFE circuit may also include a first storage register, which may be configured to receive a representation of the first value measured while the first sensor is on and enabled.

20 Claims, 5 Drawing Sheets

DISTRIBUTED BATTERY PROPERTY MEASUREMENT SYSTEM

CLAIM OF PRIORITY

This patent application claims the benefit of priority of Lin et al. Patent Cooperation Treaty (PCT) Application filed in the China Intellectual Property Office as the PCT Receiving Office, PCT application Serial Number: PCT/CN2021/137081, entitled "LOW POWER SENSOR DATA ACQUISITION BATTERY MANAGEMENT," filed on Dec. 10, 2021, which is hereby incorporated by reference herein in its entirety.

TECHNOLOGICAL FIELD

The present disclosure relates to electronics, and more particularly, but not by way of limitation, to a sensor system that can measure one or more properties of a battery or other electrochemical energy storage system.

BACKGROUND

Modern systems can use sensors to monitor an energy storage system, such as a battery. Examples of such systems include industrial electronics, electric passenger cars, electric industrial trucks, and energy storage systems. Determining one or more conditions of the energy storage system may help in determining a state of charge (SoC) or state of health (SoH) of an energy storage system, or may help in the energy storage system adjusting one or more operating parameters or conditions.

SUMMARY

A sensor may measure one or more battery or other system values, such as may include one or more of a temperature or pressure. The sensor may receive power from a power supply, such as may include one or more of a voltage or current supply. The sensor may draw power whenever the sensor is powered on or enabled. In an energy storage system, the sensor may draw power from one or more cells in the energy storage system. The present inventors have recognized, among other things, that this power draw may result in one or more of a discharge or imbalance of an energy storage system. It may be desirable to shut down or disable one or more sensors for a period of time to conserve energy. Some signals to be sensed may change relatively slowly or may not need constant monitoring. These signals may be able to be sampled periodically.

A battery management system may include one or more analog front end (AFE) circuits connected to a host microcontroller. The one or more AFE circuits may operate at a different reference voltage level than the host microcontroller. This may be due to the sensor and AFE circuit being coupled across one or more cells in the battery system. There may not be a shared clock signal between the AFE and the host microcontroller. This can be due to a voltage level difference between the AFE and the host microcontroller. A voltage level difference may introduce a need for using one or more of a DC-isolated bus or level switching circuits for data and clock connections between the AFE and host microcontroller. DC-isolated buses may have restricted bandwidth. Level switching circuits may be one or more of expensive, power-hungry, or bulky. Thus, it may be desirable to use a message-based timing system for communication between the AFE and host microcontroller.

The present inventors have recognized, among other things, that the host microcontroller may not know when the sensor is powered on and enabled. It may be cumbersome or difficult to coordinate a read of the sensor input from the host microcontroller while the sensor is powered on and enabled. For example, the host microcontroller may have to sequence turning on the sensor, reading the sensor, and turning off the sensor. It may be helpful to use a storage register to store a value of the sensor measured when the sensor is powered on and enabled. The storage register may be configured to not record values collected when the sensor is not powered on and enabled. The storage register may be available to be read by the host microcontroller at any time, even when the sensor is powered off or down or disabled.

The present inventors have recognized, among other things, that the communication connection, such as a DC-isolated bus, between the AFE and the host microcontroller may be one or more of low bandwidth, crowded with a number of communication messages, or unstable. Therefore, it may be desirable to make message-based communications between the AFE and host microcontroller more robust, such as by monitoring for failed messages and resending failed messages. This document describes, among other things, systems and methods for measuring properties of an energy storage system using an AFE circuit and a host microcontroller.

In an example, a battery management system may include a host microcontroller, operated in accordance with a first clock signal. The battery management system may also include a first sensor, which may be configured to measure a first value of a first group of one or more cells in a battery system. The battery management system may also include a first analog front end (AFE) circuit, where the first AFE circuit may be operated in accordance with a second clock signal that may be unsynchronized with the first clock signal. The first AFE circuit may include a first pulse-width modulation (PWM) controller, which may be configured to at least one of enable or power on the first sensor while a first PWM signal from the first PWM controller is in a first state, and may be configured to at least one of disable or power off the first sensor while the first PWM signal is in a second state. The first AFE circuit may also include a first storage register, which may be configured to receive a representation of the first value measured while the first sensor is on and enabled, and may be configured to store the received first value until another representation of the first value is received. The first AFE circuit may transfer a representation of a value in the first storage register to the host microcontroller in response to a request from the host microcontroller.

In an example, a method of operating a battery management system may include at least one of powering on or enabling a first sensor coupled to an analog front end (AFE) circuit. The method may also include receiving, from the first sensor, a first value corresponding to a first group of one or more cells in a battery system, where the first value is measured while the first sensor is powered on and enabled. The method may also include storing, at the AFE circuit, a representation of the first value. The method may also include at least one of powering off or disabling the first sensor. The method may also include transferring, from the AFE circuit to a host microcontroller, a representation of the stored first value.

In an example, an interface circuit for use in a battery management system may include a first sensor, configured to measure a first value of a first group of one or more cells in a battery system. The interface circuit may also include a first analog front end (AFE) circuit which may include a first a pulse-width modulation (PWM) controller, configured to at least one of enable or power on the first sensor while a first PWM signal from the first PWM controller is in a first state, and configured to at least one of disable or power off the first sensor while the first PWM signal is in a second state. The first AFE circuit may also include a first storage register, configured to receive a representation of the first value measured while the first sensor is on and enabled, and configured to store the received first value until another representation of the first value is received. The first AFE circuit may transfer a representation of a value in the first storage register to a host microcontroller, where the transfer occurs over a DC-isolated bus.

DETAILED DESCRIPTION

This present disclosure relates to systems and methods for measuring properties of an energy storage system using an AFE circuit and a host microcontroller.

Figure 1:
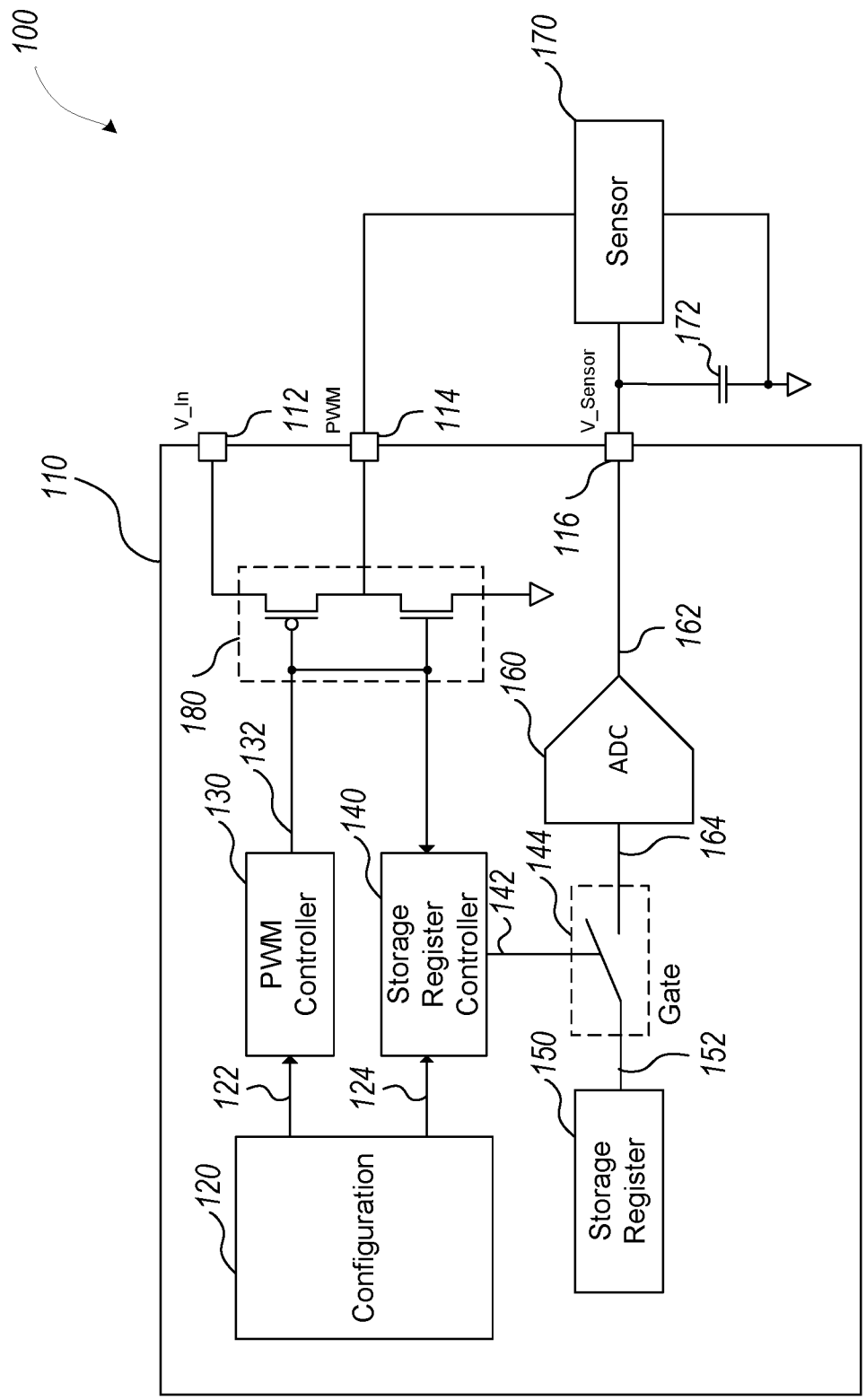
FIG. 1 is a schematic drawing of an example of portions of an analog front end (AFE) circuit and portions of a system in which the AFE circuit may be used.

FIG. 1 is a schematic drawing of an example of portions of an analog front end (AFE) circuit 110 and portions of a system 100 in which the AFE circuit 110 may be used. In FIG. 1, the AFE circuit 110 may include a configuration block 120, a pulse-width modulation (PWM) controller 130, a storage register controller 140, a storage register 150, an analog-to-digital converter (ADC) 160, and PWM output circuitry 180.

The system 100 may include a sensor 170. The sensor may include at least one or a current sensor, a voltage sensor, a temperature sensor, an impedance sensor, a battery state-of-charge sensor, or a pressure sensor. The sensor 170 may be configured to take a measurement of a value of interest of one or more cells (or groups of cells) in a battery system. The sensor 170 may be external to and coupled to the AFE circuit 110. The sensor 170 may be at least one of integrated with or internal to the AFE circuit 110. The sensor 170 may operate using electrical power, such as from one or more of a stable voltage or current source. The sensor 170 may receive electrical power from the AFE circuit 110. The sensor 170 may be connected to a PWM node 114 to receive electrical power from the AFE circuit 110. The sensor 170 may also be connected to ground to provide a return path for electrical charge used to power the sensor 170. The sensor may be at least one of powered on or enabled when the voltage at the PWM node 114 is high. The sensor 170 may be at least one of powered off or disabled when the voltage at the PWM node 114 is low. In an example, the sensor 170 may not be powered from the AFE circuit 110 and the signal on the PWM node 114 may serve to enable or disable the sensor 170. Disabling the sensor 170 may help reduce power consumption from the power source.

The sensor 170 may produce an output signal, such as may include one or more of an analog output signal or a digital output signal. The output signal may include an analog voltage output. The output signal may be connected to the V_Sensor node 116. The V_Sensor node 116 may be connected to ground via a capacitor 172. This may help provide one or more of filtering or buffering for the voltage on the V_Sensor node 116. The operation of the ADC 160 may make it desirable to use this or other voltage buffering on the input at node 162 of the ADC 160.

The sensor 170 may be a passive sensor. This may include a configuration of one or more of one or more resistors, one or more thermistors, one or more inductors, one or more capacitors, or one or more other passive elements. The sensor 170 may include one or more active elements. This may include one or more of one or more transistors, one or more amplifiers, one or more current sources, one or more voltage sources, or one or more other active elements. The sensor 170 may be an electronic sensor. This may include one or more of a processor, memory, or control circuitry.

The sensor 170 may be constructed using one or more resistors in combination with one or more thermistors. The one or more resistors may have a consistent or generally consistent resistance over a range of temperatures. The one or more thermistors may have a resistance that is configured to vary over a range of temperatures. The resistance of the thermistor may decrease as temperature increases. The resistance of the thermistor may increase as temperature increases. In an example, the sensor 170 may be constructed using a resistor in series with a thermistor between the PWM node 114 and ground. For example, this may include the resistor having a first terminal connected to the PWM node 114 and the second terminal connected to the sensor node 116. In this example, the thermister may include a first terminal connected to the sensor node 116 and a second terminal connected to a ground node. Thus, the sensor node 116 may be connected between the resistor and the thermistor. The voltage at the sensor node 116 may change with the sensed value, such as temperature. The voltage at the sensor node 116 may be able to be converted to a temperature value using one or more of a specified relationship or calibrated relationship. The capacitor 172 may result in the voltage at the sensor node 116 taking a period of time, such as a delay time, to stabilize before it corresponds to the sensed temperature.

The PWM controller 130 may generate a PWM signal on the PWM output node 132. The PWM signal may have a frequency and a duty cycle. For example, the PWM signal may have a frequency of 1 Hz and a duty cycle of 25%. This may result in the PWM signal turning on for 0.25 seconds and off for 0.75 seconds before repeating the cycle. For example, the PWM frequency may include one or more of 100 Hz, 10 Hz, 1 Hz, 0.1 Hz, 0.01 Hz, or 0.001 Hz and the PWM duty cycle may include one or more of 99.999%, 99.99%, 99.9%. 99%, 50%, 25%, 10%, 1%, 0.1%, 0.01% or 0.001%. The PWM controller 130 may be connected to the configuration block 120. The configuration block 120 may provide one or more configuration values to the PWM controller 130. Such a configuration value may include one or more of a value for configuring the PWM signal frequency or a value for configuring the PWM duty cycle. The configuration block 120 may pass the configuration values to the PWM controller 130 as one or more register values.

The PWM output node 132 may be connected to the PWM output circuitry 180. The PWM controller 130 may provide one or more of a low voltage or current PWM signal to the PWM output circuitry 180 at node 132. The PWM output circuitry 180 may amplify the signal at node 132 to one or more of a higher voltage or higher current signal on the PWM node 114. The PWM output circuitry 180 may include one or more switching devices, such as may include field effect transistors (FETs). The PWM output circuitry 180 may be connected to an operating voltage on the V_in node 112. The PWM output circuitry 180 may be connected to a power on or enable voltage, for the sensor 170, on the PWM node 114. The PWM output circuitry 180 may also be connected to a ground or reference voltage.

The PWM output circuitry 180 may be controlled to operate to electrically connect the PWM node 114 to the V_in node 112 when the signal from the PWM controller 130 is in a first state, such as may include an "off" state. The PWM output circuitry 180 may operate to electrically connect the PWM node 114 to ground when the signal from the PWM controller 130 is in a second state, such as may include an "on" state.

The ADC 160 may take in an analog signal input from the sensor node 116 and convert the analog signal input at node 116 into a digital representation for output at node 164. Thus, ADC 160 may include an input node 162 and an output node 164. The ADC 160 may convert the analog signal input to a digital output using analog-to-digital conversion circuitry employing a conversion technique such as delta-sigma, successive approximation, flash, or integration. The ADC output signal one the output node 164 may have a number of bits of resolution, such as can include 8, 10, 12, 14, 16, or 32 bits. The ADC 160 may accept a range of input values, such as can include 0 to 5V, 0 to 10V, or 0 to 100V. The ADC 160 may be a differential ADC. The ADC 160 may accept a range of differential input values, such as can include −5V to 5V, −10V to 10V, and −100V to 100V. The output node 164 may be connected to the storage register gate 144.

The storage register gate 144 may be controlled to be operable to allow the output node 164 of the ADC 160 to write to the input node 152 of the storage register 150 when the storage register gate 144 control input 142 is in a first state. The storage register gate 144 may be operable to prevent the output node 164 of the ADC 160 from writing to the input node 152 of the storage register 150 when the storage register gate 144 control input 142 is in a second state. The control input 142 may be connected to the storage register controller 140.

The storage register controller 140 may be connected to the PWM output circuitry 180, such as to receive an indication of the PWM output node 132 state. The storage register controller 140 may be connected to the configuration block 120, such as to receive a delay configuration. The storage register controller 140 may be connected to the storage register gate 144. The storage register controller 140 may be configured to allow the ADC 160 to write to the storage register 150 when the PWM controller 130 has been in a first state for a configurable amount of delay time. The storage register controller 140 may be configured to prevent the ADC 160 from writing to the storage register 150 when one or more of the PWM controller 130 is in a second state, or the PWM controller 130 has been in a first state for less than the configurable amount of delay time. The storage register controller 140 may receive the configurable delay time from the configuration block 120, such as by receiving a register value from the configuration block 120.

The storage register 150 may store a value received on the input node 152 until another value is received on the input node 152. The value in the storage register 150 may be one or more of stored or available regardless of the state of the PWM controller 130 or the signal on the PWM node 114.

The configuration block 120 may one or more of store or receive configuration values to pass to one or more of the PWM controller 130 or the storage register controller 140. The configuration block 120 may receive configuration values from a host microcontroller. The configuration block 120 may pass a first configuration value set over node 122 to the PWM controller 130 and a second configuration value set over node 124 to the storage register controller 140.

Figure 2:
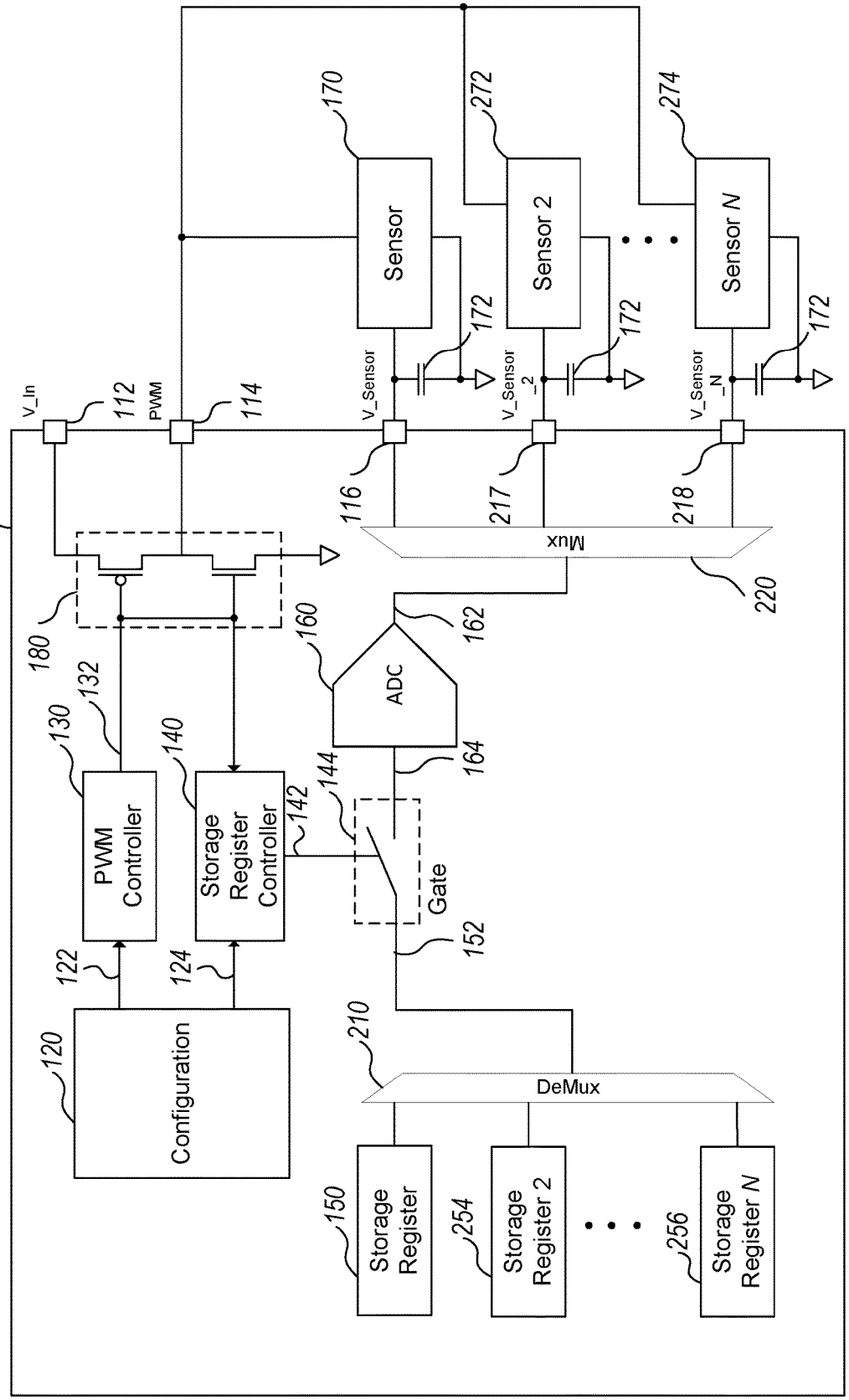
FIG. 2 is a schematic drawing of an example of portions of an AFE circuit and portions of a system in which the AFE circuit may be used.

FIG. 2 is a schematic drawing of an example of portions of an AFE circuit 110 and an example of portions of a system 100 in which the AFE circuit 110 may be used. In FIG. 2, the AFE circuit 110 may include a similar configuration to FIG. 1 while including N sensors and N storage registers. In addition to the components of FIG. 1, FIG. 2 may include a second sensor 272, an Nth sensor 274, a multiplexer 220, a demultiplexer 210, a second storage register 254, and an Nth storage register 256. There may be an integer number N of sensors and storage registers that are not shown.

The second sensor 272 and the Nth sensor 274 may be configured similarly to the sensor 170, or they may differ in one or more ways. In an example, all of the sensors may be temperature sensors. In an example, at least one of the sensors may be a temperature sensor and at least one of the sensors may be a pressure sensor. The second sensor 272 may have its output connected to the V_Sensor_2 node 217. The Nth sensor 274 may have its output connected to the V_Sensor_N node 218. One or more of the sensors may be powered on or enabled by the signal on the PWM node 114. In an example, all the sensors are powered on or enabled by the signal on the PWM node 114. In an example, the AFE circuit 110 may include a second PWM controller, second PWM output circuitry, and a second PWM node, and one or more of the sensors may be powered on or enabled by the second PWM node. The second PWM node may have the same frequency and duty cycle as the PWM node 114. The second PWM mode may have the same phase as the PWM node 114 or a different phase. The second PWM node may have one or more of a different frequency or a different duty cycle than the PWM node 114.

The multiplexer 220 may receive as inputs the V_Sensor node 116, the V_Sensor_2 Node 217, and the V_Sensor_N node 218. The multiplexer 220 may select between the inputs a specified output to provide to the input node 162 of the ADC 160.

The demultiplexer may have an input connected to the storage register input node 152, and may route the input to a specified output selected from one or more of the storage register 150 input, the second storage register 254 input, or the Nth storage register 256 input. The demultiplexer 210 and the multiplexer 220 may be coordinated so that a single ADC 160 and gate 144 can be used to service all of the sensors and storage registers. For example, the multiplexer 220 may connect the V_Sensor node 116 to the ADC 160 at the same time as the demultiplexer 210 connects the storage register 150 to the register input node 152. The multiplexer 220 may connect the V_Sensor_2 node 217 to the ADC 160 at the same time as the demultiplexer 210 connects the second storage register 254 to the register input node 152. The demultiplexer 210 and the multiplexer 220 may operate similarly for the remaining sensors and storage registers. In an example, there may be more than one ADC. In an example, there may be more than one storage register gate. The ADC 160 may also be used for the conversion of one or more signals not generated by the sensors, such as by using one or more of another multiplexer input or other control circuitry.

Figure 3:
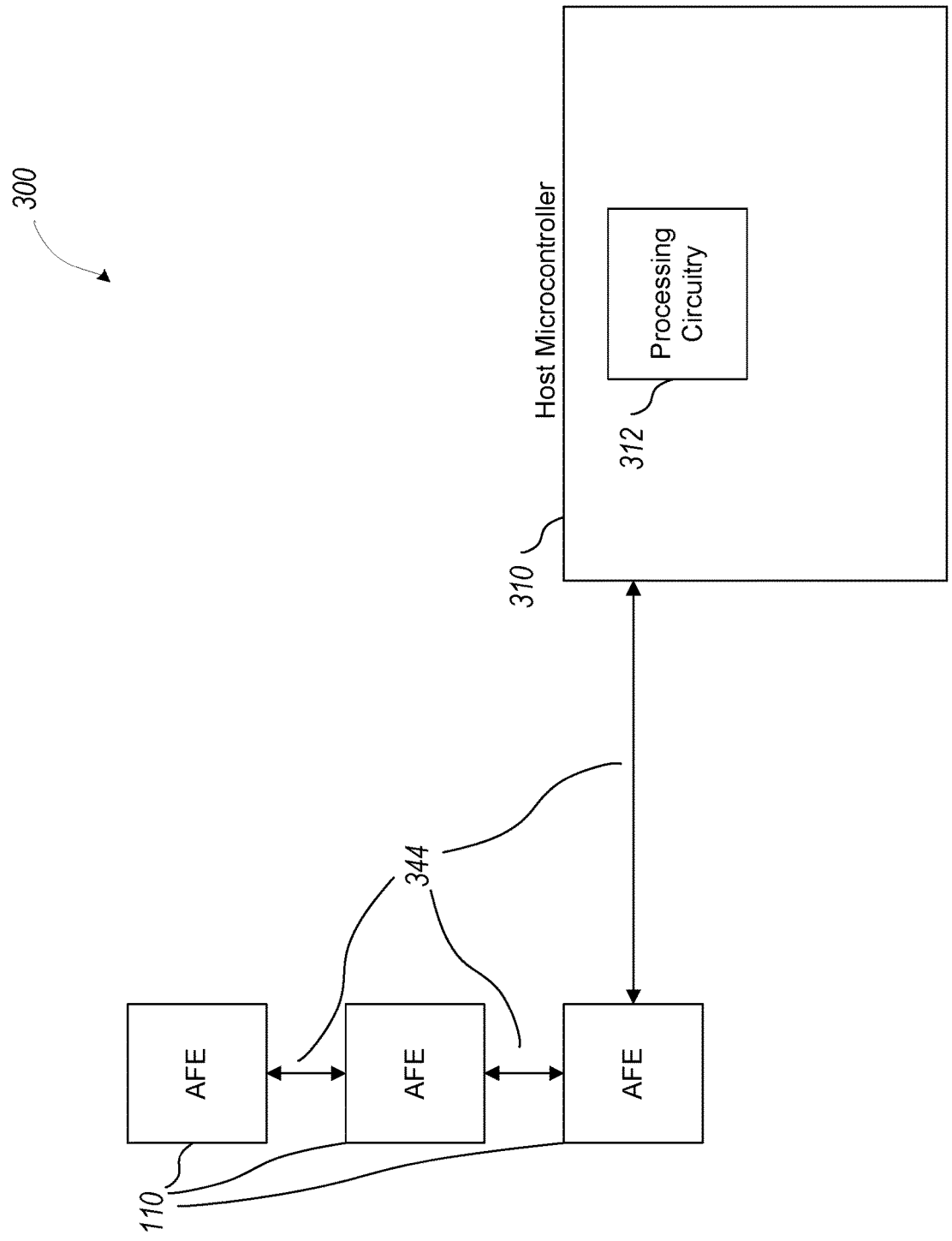
FIG. 3 is a block diagram showing an example of a portion of a battery property measurement system including a number of AFE circuits and a host microcontroller.

FIG. 3 is a block diagram showing an example of a portion of a battery property measurement system 300 including a number of AFE 110 circuits and a host microcontroller 310. The battery property measurement system 300 may comprise or be included in a battery management system. In FIG. 3, the host microcontroller 310 may be connected to the AFE circuits 110 using a communication bus 344. The AFE circuits 110 may be arranged serially or "daisy-chained" with respect to the communication bus 344. In an example, the AFE circuits 110 may be connected in parallel or in a "star" format. In an example, the AFE circuits 110 may be connected using a combination of "daisy-chained" and "star" formats. Each of the AFE circuits 110 need not be directly connected to the host microcontroller 310 with a communication bus 344, but each of the AFE circuits 110 may be able to communicate to the host microcontroller 310 over the communication bus 344, such as may include communicating to the host microcontroller 310 through one or more other AFE circuits 110. An AFE circuit 110 and a sensor 170 together may comprise an interface circuit for use in a battery property measurement system 300.

The communication bus 344 may transmit digital or analog signals. In an example, the communication bus 344 is a digital serial bus carrying data between various circuits. The communication bus 344 may be a DC-isolated bus that uses at least one of capacitive-coupling or inductive-coupling to connect circuits operating at different voltage levels due to their connection to the energy storage system at differing points. A transformer may be used at various points along the communication bus 344 such as to provide DC isolation and inductive-coupling. A capacitor may be used at various points along the communication bus 344 to provide DC isolation and capacitive coupling. In an example, the communication bus 344 may have a limited bandwidth such as to conserve resources due to the need for DC isolation or voltage level shifting circuitry between host microcontroller 310 and the AFE circuits 110. In an example, the communication bus 344 may not need or have a universally shared clock signal between all of the connected circuits. In an example, the host microcontroller 310 and one or more of the AFE circuits 110 have their own local clocks that can be asynchronous with one another. The system may avoid distributing a clock signal because of the difficulty and expense or power consumption of distributing a clock signal between circuits at different DC voltage levels.

The host microcontroller 310 may include processing circuitry 312. The host microcontroller 310 may operate according to an internal clock signal, such as a precision crystal oscillator. The clock of the host microcontroller 310 may not be synchronized, or may be unsynchronized, with the respective clocks of the AFE circuits 110. The host microcontroller 310 may send commands to a specific AFE circuit 110, or read a register of a specific AFE circuit 110, such as by addressing each of the various AFE circuits 110 using a unique identifier number or code. The host microcontroller 310 may be able to verify that a command was one or more of successfully received or successfully executed by an AFE circuit 110. The host microcontroller 310 may be able to retry a command, or issue a second similar command, following an unsuccessfully executed command. The host microcontroller 310 may be able to verify that the value returned by reading a register in an AFE circuit 110 is the correct value, such as by using error-checking values and error-checking logic.

The host microcontroller 310 may be able to read register values in the AFE circuit 110, such as through an AFE circuit 110 communication controller or by directly addressing a register. The AFE circuit 110 may transfer one or more register values to the host microcontroller 310 in response to a request from the host microcontroller 310. The host microcontroller 310 may be able to read one or more of the storage register 150, the second storage register 254, or the Nth storage register 256. Following a read by the host microcontroller 310, one or more of the register values may remain unchanged. The host microcontroller 310 may be able to write to one or more registers in the AFE circuit 110, such as through an AFE circuit 110 communication controller or by directly addressing a register. The host microcontroller 310 may be able to write to one or more registers in the configuration block 120, such as may include a PWM frequency register, a PWM duty cycle register, or a delay register.

The AFE circuits 110 may each monitor the same group of one or more cells in the battery system, or one of the AFE circuits 110 may monitor one or more separate groups of one or more cells in the battery system, such as may include a second group of one or more cells in the battery system. The AFE circuits 110 may be configured similarly or may differ in one or more ways.

The processing circuitry 312 may include software-based processing circuitry, and may be capable of performing various mathematical operations. The processing circuitry 312 may be used to determine a sensor value based upon register values received from the AFE circuit 110.

Figure 4:
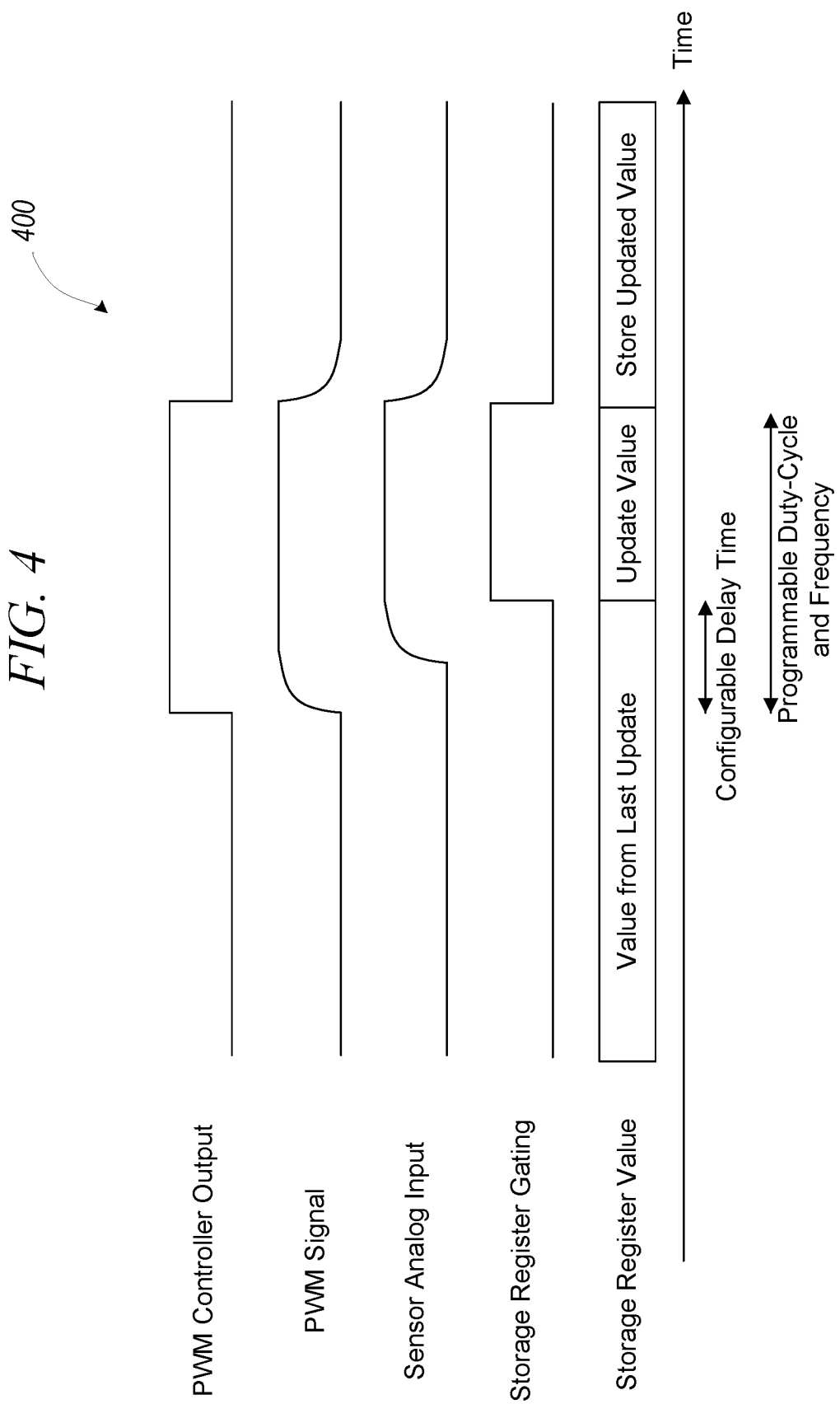
FIG. 4 is a graph in time showing an example of operating portions of an AFE circuit.

FIG. 4 is a graph in time 400 showing an example of operating portions of an AFE circuit 110. FIG. 4 shows a PWM controller 130 output, a PWM signal output on the PWM node 114, a sensor analog input on the V_Sensor node 116, a state of the storage register gate 144, and a state of the storage register 150 value. The PWM controller 130 output is initially shown in a first state, such as may include one or more of an off state or a logical low state. After a period of time, such as may be determined by one or more of the frequency, duty cycle, or phase of the PWM controller 130, the PWM controller 130 output transitions to a second state, such as may include one or more of an on state or a logical high state. The PWM controller 130 output may remain in the second state for a period of time, such as may be determined by one or more of a duty cycle or frequency of the PWM controller 130 before returning to the first state. This cycle of the PWM controller 130 output may repeat at recurring intervals, such as may include generally consistent intervals.

The PWM signal may initially be at a ground level or reference potential, such as may be while the PWM controller 130 output is in the first state. Following the transition of the PWM controller 130 output to the second state, the PWM signal may begin changing to the voltage level on the V_In node 112, such as due to one or more FETs in the PWM output circuitry 180 turning one or more of on or off. The voltage on the PWM node 114 may not rise as quickly as the voltage of the PWM controller 130 output, such as may be due to one or more of a switching speed of a FET in the PWM output circuitry 180, a capacitor charging, or a temporary voltage level drop on V_In node 112. After the PWM signal rises to match or approximately match the voltage on V_In node 112, the PWM signal may remain generally consistent while the PWM controller 130 output remains in the second state. Following the transition of the PWM controller 130 output back to the first state, the PWM signal may fall or decay back to a ground potential. The PWM signal may not fall as quickly as the PWM controller 130 output such as may be due to a capacitor discharging.

The sensor analog input may initially be at one or more of a low level or a ground potential, such as may be due to the sensor 170 being one or more of powered off or not enabled. Following the transition of the PWM controller 130 output and the PWM signal to a second state, the sensor 170 may be one or more of powered on or enabled, which may result in the sensor analog input rising above a ground potential. The sensor analog input value may not rise as quickly as the PWM signal such as may be due to one or more of a capacitor, such as may include capacitor 172, charging, an electronic circuit powering on, or a delay in the sensor 170 reading. Following an initial power-up time, the sensor 170 may enter a steady state condition with a sensor analog input value that corresponds to the measurement conditions of the sensor 170. Following the PWM signal returning to the first state, the sensor 170 may be one or more of powered off or disabled and the sensor analog input may decay or fall back to a ground potential.

The storage register gate 144 may be initially closed, such as may prevent a value from the ADC 160 being stored in the storage register 150. The storage register gate 144 may remain closed until the PWM controller 130 output has entered the second state and a configurable delay time has passed. The configurable delay time may be selected to allow the PWM signal to rise and the sensor 170 to reach a steady state measurement before the ADC 160 can write to the storage register 150. This may help to prevent data collected when the sensor 170 was not fully powered on and enabled from being stored in the storage register 150, such as may help to prevent invalid data from being collected by the host microcontroller 310. Following the transition of the PWM controller 130 output to the first state, the storage register gate 144 may operate to prevent the ADC 160 from writing to the storage register 150, such as may include shutting the storage register gate 144 as quickly as the storage register gate 144 and storage register gate controller 140 are able.

The value in the storage register 150 may initially be the value from the last time the storage register 150 was updated, or a value that was present or generated upon startup. Following the opening of the storage register gate 144, the ADC 160 may be able to update the value of the storage register 150. The ADC 160 may update the value one or more times while the storage register gate 144 is open. Following the closing of the storage register gate 144, the storage register 150 may store the most recently received value until the storage register gate 144 is opened again and another value is received. The storage register 150 may be able to be read by the host microcontroller 310 at any time, and may provide the current value in the storage register 150 to the host microcontroller 310.

If the rate of change of the analog signal of interest measured by the sensor 170 is relatively slow, the host microcontroller 310 may always receive data with a relative degree of accuracy. If the rate of change of the analog signal of interest measured by the 170 is relatively faster, the host microcontroller 310 may receive data with a relatively lower degree of accuracy. The degree of accuracy desired for various signals may vary. The frequency and duty cycle of the PWM controller 130 may be selected based upon one or more of a desired degree of accuracy or a normal rate of change of the analog signal of interest. In an example, one or more of the frequency and duty cycle of the PWM controller 130 may be adjusted based upon a measured rate of change in the analog signal of interest. The duty cycle and frequency may be selected to help ensure that the ADC 160 can sample the input node 162 at least one time during the time that the storage register gate 144 is open.

Figure 5:
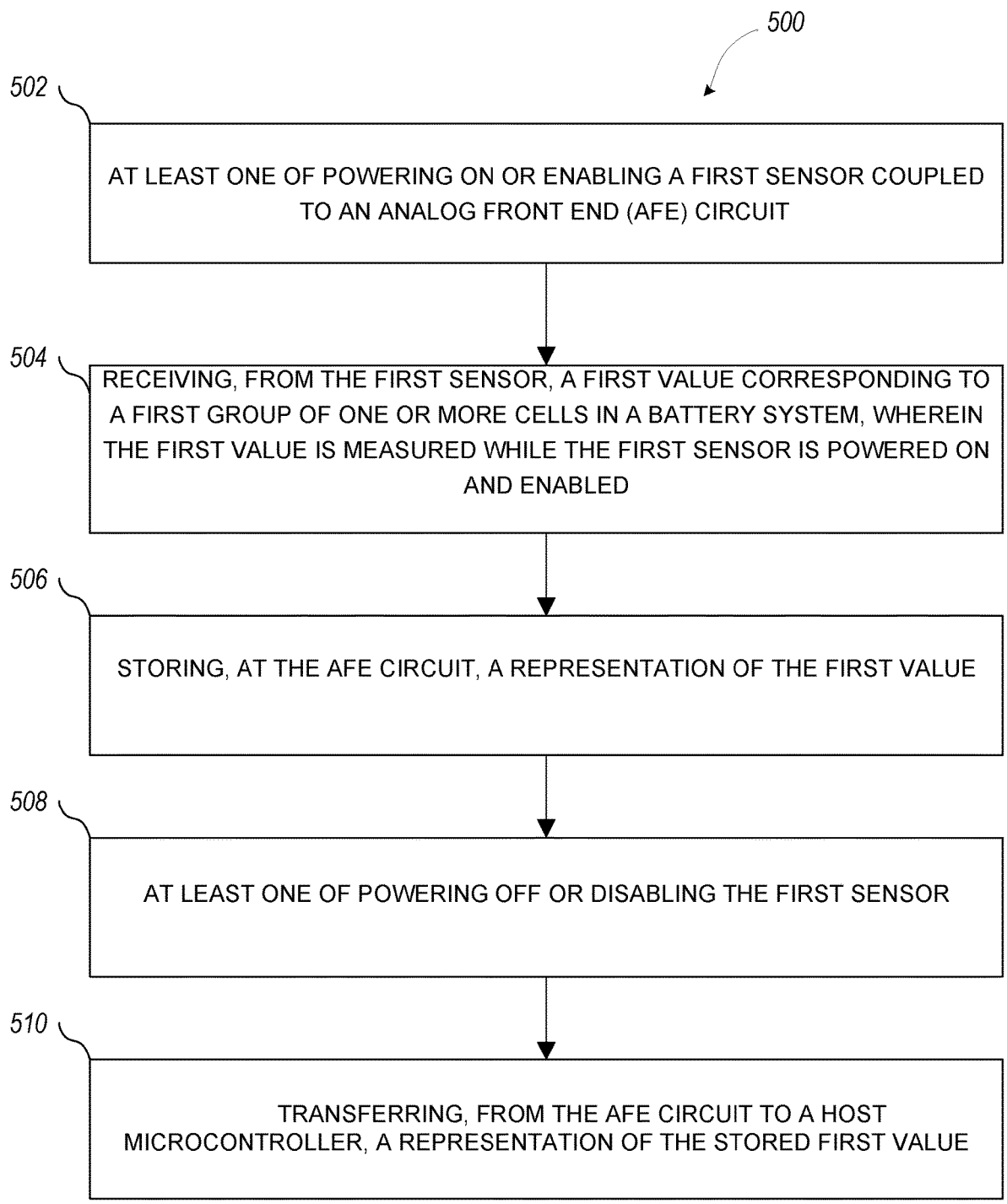
FIG. 5 is a flow chart showing an example of a method for operating portions of a battery property measurement system.

FIG. 5 is a flow chart 500 showing an example of a method for operating portions of a battery property measurement system 300. At 502—a first sensor coupled to an analog front end (AFE) circuit can be at least one of powered on or enabled. At 504—a first value can be received from the first sensor corresponding to a first group of one or more cells in a battery system, where the first value is measured while the first sensor is powered on and enabled. At 506—a representation of the first value can be stored at the AFE circuit. At 508—the first sensor can be at least one of powered off or disabled. At 510—a representation of the stored first value can be transferred from the AFE circuit to a host microcontroller. The shown order of steps is not intended to be a limitation on the order the steps are performed in. In an example, two or more steps may be performed simultaneously or at least partially concurrently.

The actions at 502 and 508 may be completed using circuitry such as may include the PWM controller 130 and the PWM output circuitry 180. 506 may be completed by storing an output of the ADC 160 in the storage register 150. The storage register gate 144 may help to prevent data collected when the first sensor is not powered on and enabled from being received in step 504. The transfer in 510 may occur over a communication bus 344.

The systems, techniques, and methods described herein are believed to apply, at least in part, to AFE circuits 110 using voltage ADCs and current ADCs. The AFE circuit 110 is believed to be operable with a wide range of sensor types and styles and a varying number of sensors.

Each of the non-limiting aspects above can stand on its own or can be combined in various permutations or combinations with one or more of the other aspects or other subject matter described in this document.

The above detailed description includes references to the accompanying drawings, which form a part of the detailed description. The drawings show, by way of illustration, specific embodiments in which the invention can be practiced. These embodiments are also referred to generally as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc., are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Such instructions can be read and executed by one or more processors to enable performance of operations comprising a method, for example. The instructions are in any suitable form, such as but not limited to source code, compiled code, interpreted code, executable code, static code, dynamic code, and the like.

Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A battery management system comprising:
a host microcontroller, operated in accordance with a first clock signal;
a first sensor, configured to measure a first value of a first group of one or more cells in a battery system;
a first analog front end (AFE) circuit, wherein the first AFE circuit is operated in accordance with a second clock signal that is unsynchronized with the first clock signal, the first AFE circuit comprising:
a first pulse-width modulation (PWM) controller, configured to at least one of enable or power on the first sensor while a first PWM signal from the first PWM controller is in a first state, and configured to at least one of disable or power off the first sensor while the first PWM signal is in a second state;
a first storage register, configured to receive a representation of the first value measured while the first sensor is on and enabled, and configured to store the received first value until another representation of the first value is received; and
wherein the first AFE circuit transfers a representation of a value in the first storage register to the host microcontroller in response to a request from the host microcontroller.

2. The battery management system of claim 1, further comprising:
a second sensor, configured to measure a second value of a second group of one or more cells in the battery system;
a second analog front end (AFE) circuit, wherein the second AFE circuit is operated in accordance with a third clock signal that is unsynchronized with the first clock signal, the second AFE circuit comprising:
a second pulse-width modulation (PWM) controller, configured to at least one of enable or power on the second sensor while a second PWM signal from the second PWM controller is in a first state, and configured to at least one of disable or power off the second sensor while the second PWM signal is in a second state;
a second storage register, configured to receive a representation of the second value measured while the second sensor is on and enabled, and configured to store the received second value until another representation of the second value is received; and
wherein the second AFE circuit transfers a representation of a value in the second storage register to the host microcontroller in response to a request from the host microcontroller.

3. The battery management system of claim 2, wherein the third clock signal is unsynchronized with the second clock signal.

4. The battery management system of claim 1, wherein the first sensor includes at least one of a temperature sensor, an impedance sensor, a battery state-of-charge sensor, or a pressure sensor.

5. The battery management system of claim 1, further comprising:
a third sensor, configured to measure a third value of the first group of one or more cells; and wherein the first AFE circuit further comprises:
a third pulse-width modulation (PWM) controller, configured to at least one of enable or power on the third sensor while a third PWM signal from the third PWM controller is in a first state, and configured to at least one of disable or power off the third sensor while the third PWM signal is in a second state;
a third storage register, configured to receive a representation of the third value measured while the third sensor is on and enabled, and configured to store the received third value until another representation of the third value is received; and
wherein the first AFE circuit transfers a representation of a value in the third storage register to the host microcontroller in response to a request from the host microcontroller.

6. The battery management system of claim 5, wherein the third sensor includes a different type of sensor than the first sensor.

7. The battery management system of claim 5, wherein the third PWM controller and the first PWM controller comprise the same PWM controller.

8. The battery management system of claim 1, wherein the first PWM controller has configurable settings for a frequency and a duty cycle of the first PWM controller.

9. The battery management system of claim 8, wherein the configurable settings for the frequency and the duty cycle of the first PWM controller are configured by storing values in a frequency register and a duty cycle register of the first PWM controller respectively.

10. The battery management system of claim 9, wherein the first storage register is controlled by a first storage register controller, wherein the first storage register controller is configured to allow a representation of the first value measured while the first sensor is powered on and enabled to be stored in the first storage register, and is configured to prevent a representation of the first value measured while the first sensor is not powered on and enabled from being stored in the first storage register.

11. The battery management system of claim 10, wherein the first storage register controller has a configurable setting for a delay time, wherein the delay time corresponds to a period of time between a time that the first sensor is powered on and enabled and a time that a representation of the first value is allowed to be stored in the first storage register.

12. The battery management system of claim 11, wherein the configurable setting for the delay time is configured by storing a value in a delay time register of the first storage register controller.

13. The battery management system of claim 12, wherein at least one of the frequency register, the duty cycle register, or the delay time register are configured to receive respective values from a configuration block within the first AFE circuit, wherein the host microcontroller is configured to update the values in the configuration block.

14. The battery management system of claim 1, wherein the value in the first storage register remains unchanged following transfer of the representation of the value in the first storage register to the host microcontroller.

15. A method of operating a battery management system, the method comprising:
at least one of powering on or enabling a first sensor coupled to an analog front end (AFE) circuit;
receiving, from the first sensor, a first value corresponding to a first group of one or more cells in a battery system, wherein the first value is measured while the first sensor is powered on and enabled;
storing, at the AFE circuit, a representation of the first value;
at least one of powering off or disabling the first sensor;
transferring, from the AFE circuit to a host microcontroller, a representation of the stored first value.

16. The method of claim 15, further comprising controlling the first sensor using a pulse-width modulation (PWM) signal generated within the AFE circuit, including at least one of enabling or powering on the first sensor while the PWM signal is in a first state, and at least one of disabling or powering off the first sensor while the PWM signal is in a second state.

17. The method of claim 16, further comprising configuring at least one of a frequency or a duty cycle of the PWM signal by sending a first configuration value set from the host microcontroller and storing the first configuration value set in the AFE circuit.

18. The method of claim 15, wherein the receiving the first value from the first sensor includes receiving the first value wherein the first value is measured following a delay time after the first sensor is powered on and enabled.

19. The method of claim 15, wherein the transferring a representation of the stored first value occurs over a DC-isolated bus.

20. An interface circuit for use in a battery management system, the interface circuit comprising:
a first sensor, configured to measure a first value of a first group of one or more cells in a battery system; and
a first analog front end (AFE) circuit comprising:
a first pulse-width modulation (PWM) controller, configured to at least one of enable or power on the first sensor while a first PWM signal from the first PWM controller is in a first state, and configured to at least one of disable or power off the first sensor while the first PWM signal is in a second state;
a first storage register, configured to receive a representation of the first value measured while the first sensor is on and enabled, and configured to store the received first value until another representation of the first value is received; and
wherein the first AFE circuit transfers a representation of a value in the first storage register to a host microcontroller, wherein the transfer occurs over a DC-isolated bus.

* * * * *